United States Patent
Ertas et al.

(10) Patent No.: US 9,800,241 B2
(45) Date of Patent: Oct. 24, 2017

(54) HOUSEHOLD APPLIANCE COMPRISING A TOUCH BUTTON

(71) Applicant: ARCELIK ANONIM SIRKETI, Istanbul (TR)

(72) Inventors: Firdevs Basaran Ertas, Istanbul (TR); Aykun Acil, Istanbul (TR); Safak Tezcan, Istanbul (TR); Alper Batur, Istanbul (TR); Can Sar, Istanbul (TR)

(73) Assignee: ARCELIK ANONIM SIRKETI, Istanbul (TR)

(*) Notice: Subject to any disclaimer, the term of this patent is extended or adjusted under 35 U.S.C. 154(b) by 53 days.

(21) Appl. No.: 14/442,969

(22) PCT Filed: Oct. 25, 2013

(86) PCT No.: PCT/EP2013/072402
§ 371 (c)(1),
(2) Date: May 14, 2015

(87) PCT Pub. No.: WO2014/075898
PCT Pub. Date: May 22, 2014

(65) Prior Publication Data
US 2015/0295576 A1    Oct. 15, 2015

(30) Foreign Application Priority Data
Nov. 14, 2012    (TR) ................. 2012/13169

(51) Int. Cl.
*H03K 17/96*    (2006.01)
*A47L 15/42*    (2006.01)
(Continued)

(52) U.S. Cl.
CPC ........ *H03K 17/962* (2013.01); *A47L 15/4293* (2013.01); *D06F 39/005* (2013.01);
(Continued)

(58) Field of Classification Search
CPC ............... H03K 17/962; H03K 17/975; H03K 2217/960755
(Continued)

(56) References Cited

U.S. PATENT DOCUMENTS 7,332,688 B2 *    2/2008    Browne ................ B60K 37/06
                                                            200/341
2007/0103451 A1    5/2007    Heimann et al.
(Continued)

FOREIGN PATENT DOCUMENTS

CN    1442557 A    9/2003
CN    201348958 Y    11/2009
(Continued)

OTHER PUBLICATIONS

International Search Report of WO 2014/075898 A1 and Written Opinion of International Searching Authority.

*Primary Examiner* — Edwin A. Leon
*Assistant Examiner* — Ahmed Saeed
(74) *Attorney, Agent, or Firm* — Kilpatrick Townsend & Stockton LLP

(57) ABSTRACT

The present invention relates to a household appliance (1) comprising a control panel (2) having an area (A) designated thereon which provides the user to select the desired program parameters by touching, a board holder (3) situated behind the control panel (2), a circuit board (4) situated in the board holder (3), at least one touch button (7) having at least one spring (5) one end of which is fixed to the circuit board (4) and which transmits to the circuit board (4) the capacitive difference that is formed when the designated area (A) is touched and having a plate (6) which is fixed to the free end of the spring (5) so as to contact the control panel (2), and a cover (8) mounted onto the circuit holder (3) and providing the circuit board (4) to be fixed in the board holder (3). The household appliance further comprises a first
(Continued)

Figure 1:
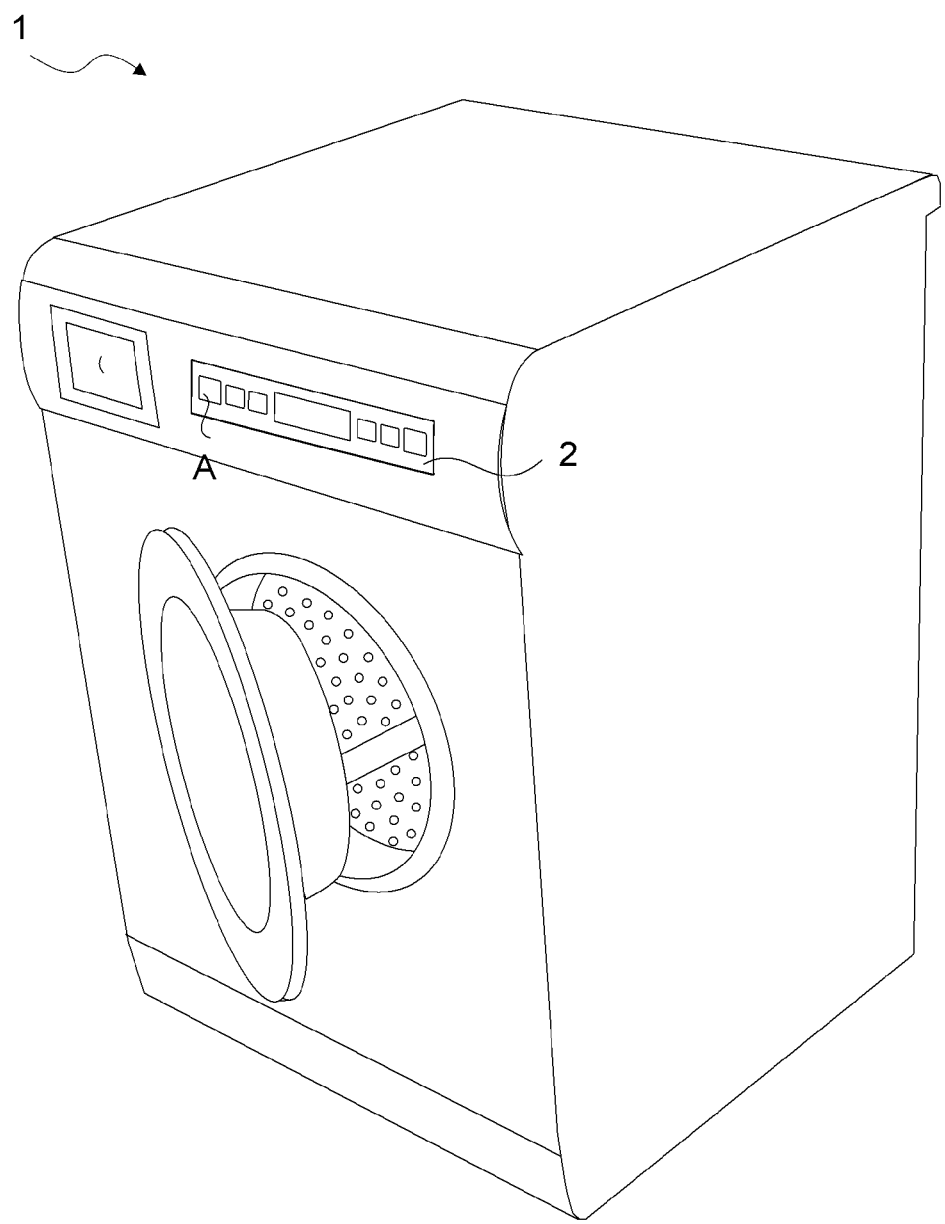

element (9) that is situated on the cover (8) and that extends outwards from the cover (8) in parallel to the spring (5), and a guide (11) that provides the cover (8) to be fixed on the board holder (3) by being mounted onto the cover (8) and that has a second element (10) that forms a housing (Y) surrounding the spring (5) by joining with the first element (9) when mounted onto the cover (8).

14 Claims, 4 Drawing Sheets

(51) Int. Cl.
    *D06F 39/00*     (2006.01)
    *F24C 7/08*     (2006.01)
    *F25D 29/00*     (2006.01)

(52) U.S. Cl.
    CPC .............. *F24C 7/082* (2013.01); *F24C 7/086* (2013.01); *F25D 29/005* (2013.01); *F25D 2400/361* (2013.01); *H03K 2217/96076* (2013.01)

(58) Field of Classification Search
    USPC ........ 200/341, 344, 345, 296, 600, 333, 5 A
    See application file for complete search history.

(56) References Cited

U.S. PATENT DOCUMENTS

| | | | |
|---|---|---|---|
| 2009/0107829 | A1 | 4/2009 | Heimann |
| 2010/0025214 | A1* | 2/2010 | Roose ................... D06F 39/005 200/5 A |
| 2011/0214978 | A1* | 9/2011 | Byrne .................. H03K 17/975 200/600 |
| 2016/0194804 | A1* | 7/2016 | Russo ................... D06F 39/005 200/5 A |

FOREIGN PATENT DOCUMENTS

| | | |
|---|---|---|
| DE | 19812334 A1 | 9/2011 |
| EP | 1786107 A1 | 5/2007 |
| EP | 2053745 A1 | 4/2009 |
| EP | 2209212 A1 | 7/2010 |
| EP | 2355117 A1 | 8/2011 |
| EP | 2471990 A1 | 7/2012 |

* cited by examiner

HOUSEHOLD APPLIANCE COMPRISING A TOUCH BUTTON

The present invention relates to a household appliance comprising a touch button situated on the control panel.

Nowadays, household appliances controlled by using touch buttons are preferred because of their ease of use and esthetic appearance. Various methods exist for the touch buttons to detect the contact of the user and detection by means of capacitive change is one of these methods. Detection of the touch movement by the circuit boards is realized by means of springs. However, the spring fixed to the circuit board may be deformed due to connection errors that may occur during the assembly of the circuit board on the control panel or of the control panel on the household appliance. In this situation, the plate fixed to the spring cannot be aligned with the designated area on the control panel. In the state of the art various embodiments are available in order to fix the position of the spring. For example, guides that are placed on the circuit board so as to surround the spring, are known. However, this embodiment cannot be utilized when the spring is positioned at a point close to the edge of the circuit board. Consequently, problems such as precision change, detecting the wrong button may occur for the touch buttons and the user cannot control the household appliance as desired by using the control panel.

In the state of the art European Patent Application No. EP1786107, a holder is disclosed, which is produced from plastic material and which extends along the spring in a capacitive touch key. It is described that the said holder positions the spring on the circuit board.

The aim of the present invention is the realization of a household appliance comprising a touch button which is prevented from being damaged during assembly or transportation and thus enabled to have a longer lifespan.

The household appliance realized in order to attain the aim of the present invention, explicated in the first claim and the respective claims thereof, comprises a control panel having an area designated for the user to touch, a board holder situated behind the control panel, a circuit board, a touch button having at least one spring which transmits the capacitive difference that forms by the user touching the designated area and a preferably rectangular plate situated between the control panel and the spring and that is mounted to the upper end of the spring, and a cover that is placed so as to prevent possible impacts to the circuit board during assembly.

The household appliance of the present invention comprises a first element that is positioned on the cover so as to be perpendicular to the cover and a guide having a second element that forms a housing limiting the movement of the springs when joined with the first element.

In an embodiment of the present invention, the second element is shaped so as to partially enclose the spring and the guide is detachably mounted onto the cover. Thus, ease of production is provided.

In a derivative of this embodiment, the first element extends perpendicularly to the cover so as to form a closed curve around the spring by joining with the second element.

In an embodiment of the present invention, there are recesses and protrusions that provide the positioning of the cover on the board holder. The operator aligns the recesses and the protrusions during assembly and mounts the cover onto the board holder.

In an embodiment of the present invention, the household appliance comprises claws situated on the board holder and openings arranged on the guide. In order to perform the mounting of the guide, the operator fits the claws into the openings.

In an embodiment of the present invention, there are channels on the cover and pins on the guide, suitable to move in the channels. The guide being mounted onto the cover by being slid accelerates the assembly process.

In an embodiment of the present invention, the household appliance comprises conical extensions on the cover in order to properly position the touch buttons, and cavities wherein the said extensions are seated.

In the household appliance of the present invention, connection errors occurring as a result of the touch button not being aligned with the designated area during assembly are prevented by means of the housing formed by the cover and the guide.

The model embodiments related to a household appliance realized in order to attain the aim of the present invention are illustrated in the attached figures, where:

FIG. 1—is the perspective view of a household appliance.

Figure 2:
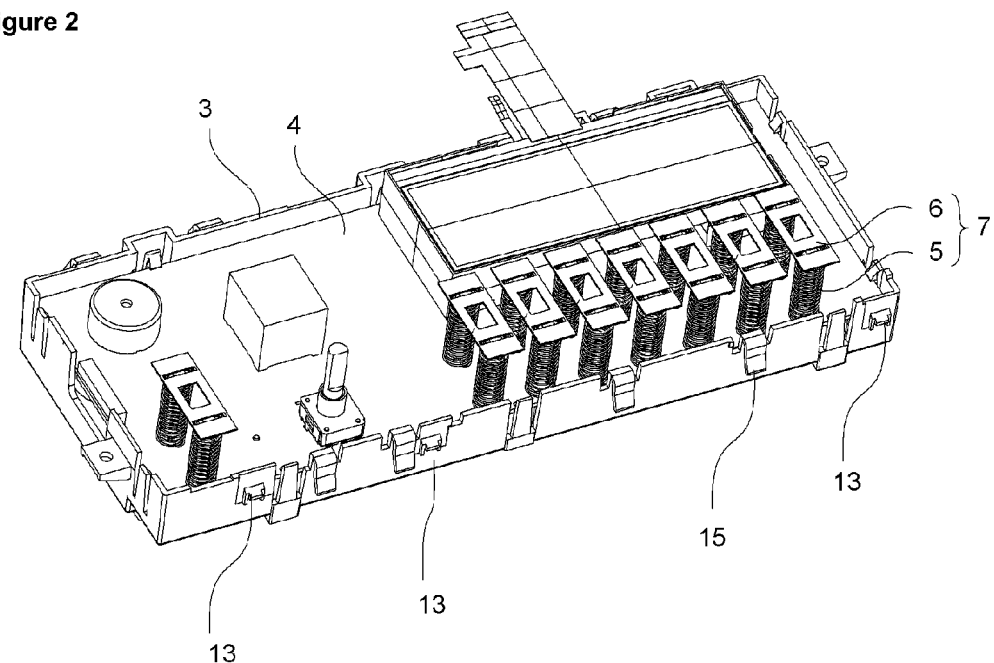

FIG. 2—is the perspective view of a board holder, a circuit board and touch buttons.

Figure 3:
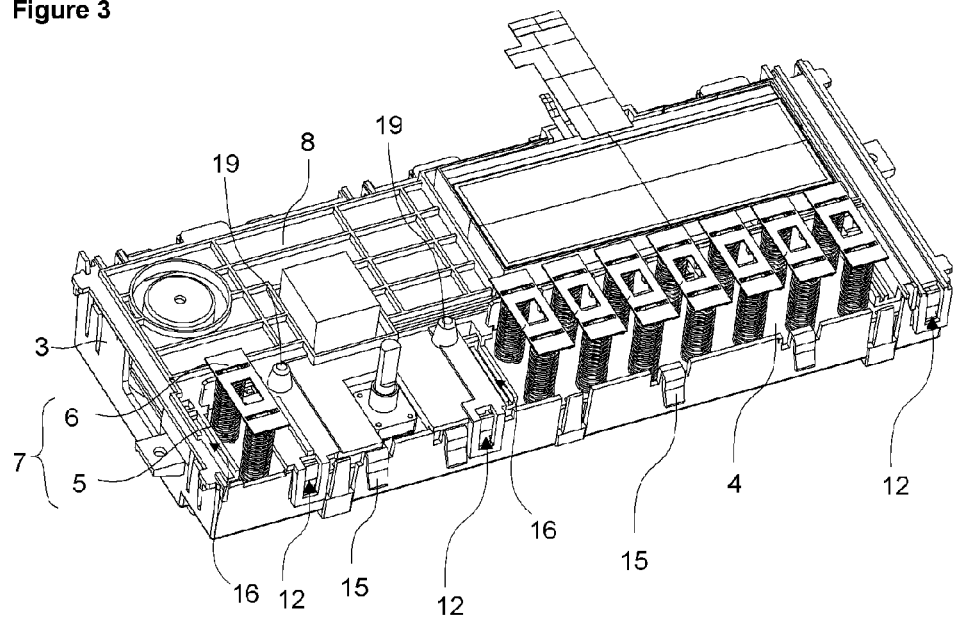

FIG. 3—is the perspective view of a board holder, a cover, a circuit board and touch buttons.

Figure 4:
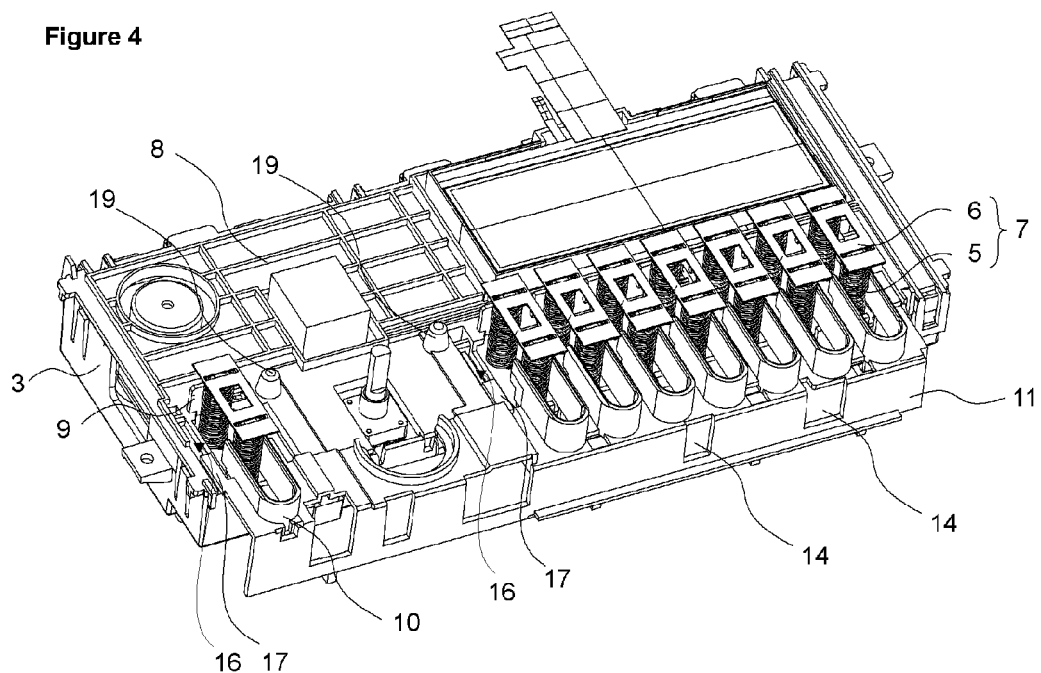

FIG. 4—is the perspective view of a board holder, a cover, a guide and touch buttons while the guide is being mounted onto the board holder.

Figure 5:
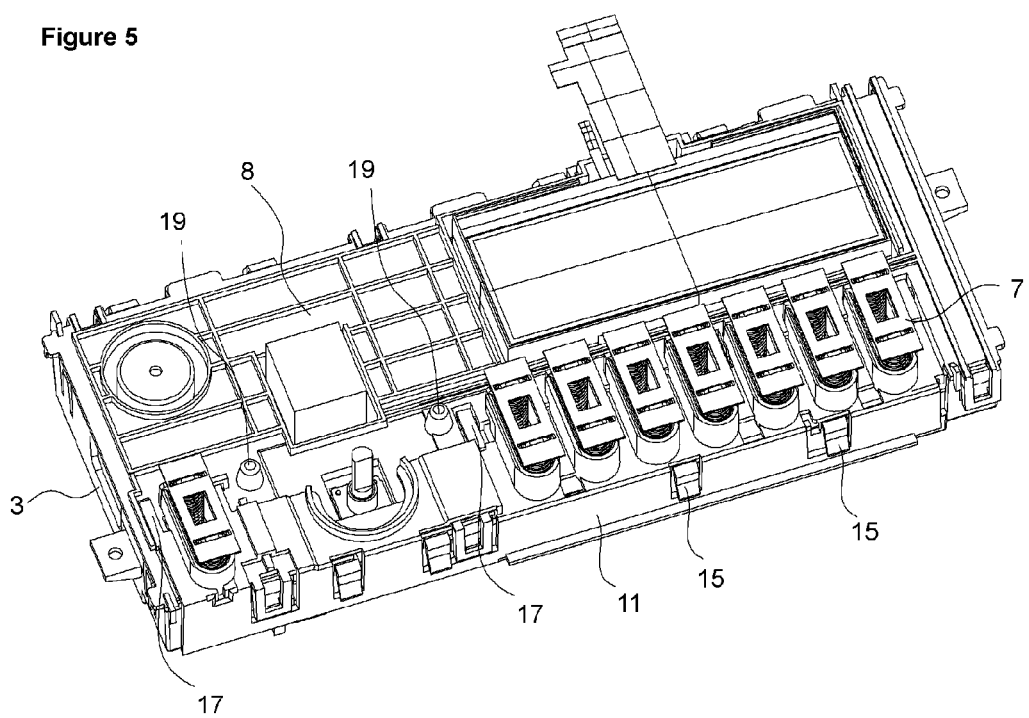

FIG. 5—is the perspective view of a board holder, a cover, a guide and touch buttons.

Figure 6:
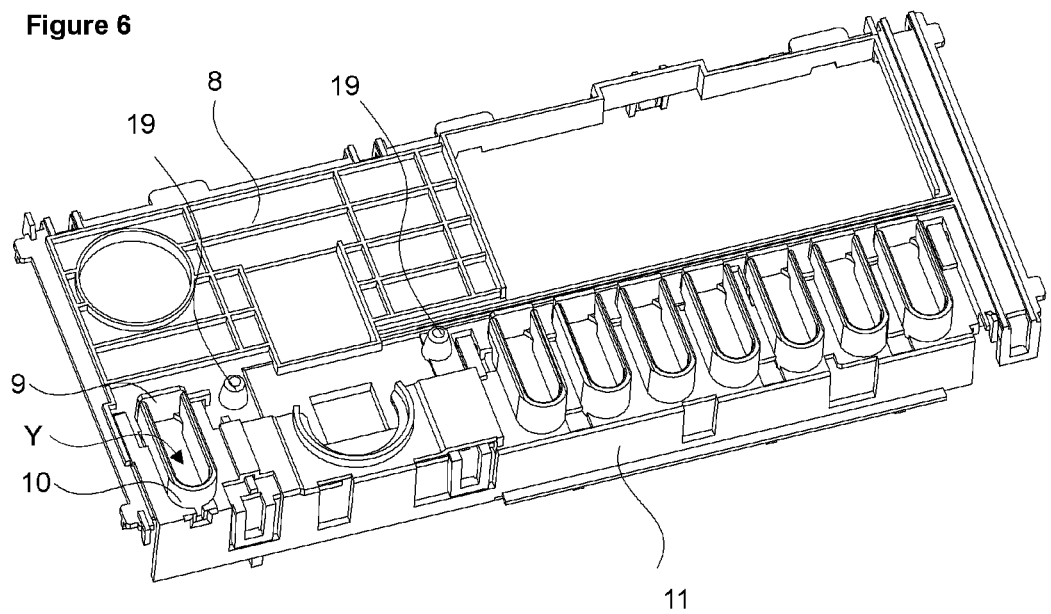

FIG. 6—is the perspective view of a cover and a guide.

Figure 7:
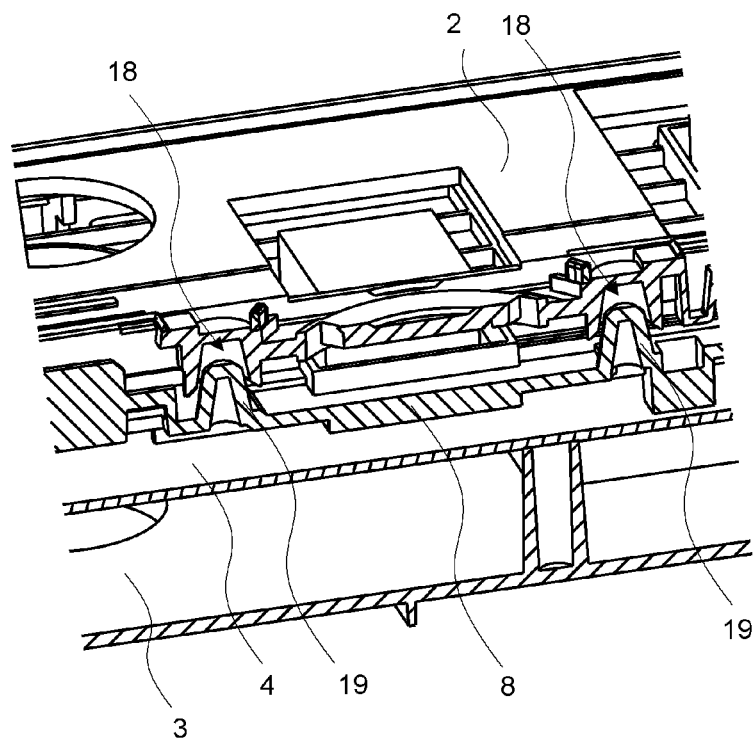

FIG. 7—is the partial cross-sectional view of a control panel and a cover while the cover is being mounted to the control panel.

The elements illustrated in the figures are numbered as follows:

1. Household appliance
2. Control panel
3. Board holder
4. Circuit board
5. Spring
6. Plate
7. Touch button
8. Cover
9. First element
10. Second element
11. Guide
12. Recess
13. Protrusion
14. Opening
15. Claw
16. Channel
17. Pin
18. Cavity
19. Extension The household appliance (1) comprises a control panel (2) having an area (A) designated thereon which provides the user to select the desired program parameters by touching, a board holder (3) situated behind the control panel (2), a circuit board (4) situated in the board holder (3), at least one touch button (7) having at least one spring (5) one end of which is fixed to the circuit board (4) and which transmits to the circuit board (4) the capacitive difference that is formed when the designated area (A) is touched and having a plate (6) which is fixed to the free end of the spring (5) so as to contact the control panel (2), and a cover (8) mounted onto the circuit holder (3) and providing the circuit board (4) to be fixed in the board holder (3) (FIG. 1, FIG. 2, FIG. 3).

The household appliance (1) of the present invention comprises a first element (9) that is situated on the cover (8) and that extends outwards from the cover (8) in parallel to the spring (5), and a guide (11) that provides the cover (8) to be fixed on the board holder (3) by being mounted onto the cover (8) and that has a second element (10) that forms a housing (Y) surrounding the spring (5) by joining with the first element (9) when mounted onto the cover (8).

When the user moves his/her finger near or touches the area (A) on the control panel (2) designated for touching, a capacitance is formed between the plate (6) and the point where his/her finger is. The electrical effect formed by the capacitance is transmitted to the circuit board (4) designed to detect the capacitance difference by means of the spring (5). The end of the spring (5) which is not connected to the circuit board (4) is connected to the plate (6) and the plate (6) on the control panel (2) is almost as large as the area (A) designated for the user to touch. When the cover (8) that prevents the circuit board (4) from moving inside the board holder (3) is placed onto the board holder (3), the first element (9) aligns with the spring (5). Similarly, when the guide (11) is placed onto the cover (8), the second element (10) aligns with the first element (9) and the spring (5). Thus, the spring (5) is provided to remain at the initial position given by the producer.

In an embodiment of the present invention, the household appliance (1) comprises the guide (11) having a U-shaped second element (10) that can be detachably mounted onto the cover (8). Thus, ease of assembly is provided (FIG. 6).

In a derivative of this embodiment, the household appliance (1) comprises the first element (9) formed as an upright so as to complete the open end of the second element (10). Thus, when the guide (11) is mounted onto the cover (8), the housing (Y) surrounding the spring (5) all around is formed.

In an embodiment of the present invention, the household appliance (1) comprises at least one recess (12) arranged on the cover (8) and at least one protrusion (13) situated on the board holder (3) and providing the first element (9) to align with the spring (5) by being seated into the recess (12). With the protrusion (13) being seated into the recess (12), the cover (8) is provided to be properly positioned (FIG. 2, FIG. 3).

In an embodiment of the present invention, the household appliance (1) comprises at least one opening (14) situated on the guide (11) and at least one claw (15) situated on the board holder (3) and providing the guide (11) to be mounted onto the cover (8) by passing through the opening (14). Thus, the guide (11) is fixed onto the board holder (3) (FIG. 4, FIG. 5).

In an embodiment of the present invention, the household appliance (1) comprises at least one channel (16) situated on the cover (8) and at least one pin (17) situated on the guide (11) and providing the guide (11) to be mounted onto the cover (8) by being slid. Before the guide (11) is placed onto the cover (8), the pins (17) are seated into the channels (16). Afterwards, the guide (11) is pushed over the cover (8), thus the first element (9) is aligned with the second element (10) (FIG. 4, FIG. 5).

In an embodiment of the present invention, the household appliance (1) comprises at least one cavity (18) arranged on the control panel (2) and at least one extension (19) situated on the cover (8) and suitable to be fitted into the cavity (18). Thus, the touch buttons (7) can be mounted as aligned with the control panel (2) (FIG. 7).

In different embodiments of the present invention, the household appliance (1) is a laundry dryer, a cooking device, a washing machine, a dishwasher or a cooling device.

The cover (8) having the first element (9) and the guide (11) having the second element (10), that together form the housings (Y) that surround the springs (5) fixed to the circuit board (4) from one end, prevent the springs (5) from being deformed in the horizontal plane and thus provides the capacitive change to be transmitted to the circuit board (4) in a reliable manner.

It is to be understood that the present invention is not limited to the embodiments disclosed above and a person skilled in the art can easily introduce different embodiments. These should be considered within the scope of the protection postulated by the claims of the present invention.

The invention claimed is:

1. A household appliance (1), comprising:
   a control panel (2) having an area (A) designated thereon which provides a user to select desired program parameters by touching;
   a board holder (3) situated behind the control panel (2);
   a circuit board (4) situated in the board holder (3), the circuit board (4) including at least one touch button (7) having at least one spring (5) one end of which is fixed to the circuit board (4) and which transmits to the circuit board (4) a capacitive difference that is formed when the designated area (A) is touched, the at least one spring (5) having a plate (6) which is fixed to a free end of the spring (5) so as to contact the control panel (2);
   a cover (8) mounted onto the board holder (3) and fixing the circuit board (4) to the board holder (3), the cover (8) having a first element (9) that is situated on the cover (8) and that extends outwards from the cover (8) in parallel to the spring (5); and
   a guide (11) mounted onto the cover (8) and fixing the cover (8) to the board holder (3), the guide (11) having a U-shaped second element (10) that aligns with the first element (9) of the cover (8), wherein the first element (9) of the cover (8) and the second element (10) of the guide (11) are detachably coupled to each other to form a housing (Y) that surrounds the spring (5).

2. The household appliance (1) as in claim 1, wherein the first element (9) is formed as an upright so as to complete an open end of the second element (10).

3. The household appliance (1) as in claim 1, further comprising:
   at least one recess (12) arranged on the cover (8); and
   at least one protrusion (13) situated on the board holder (3) and aligning the first element (9) with the spring (5) by being seated into the recess (12).

4. The household appliance (1) as in claim 1, further comprising:
   at least one opening (14) situated on the guide (11); and
   at least one claw (15) situated on the board holder (3) and providing the guide (11) to be mounted onto the cover (8) by passing through the opening (14).

5. The household appliance (1) as in claim 1, further comprising:
   at least one channel (16) situated on the cover (8); and
   at least one pin (17) situated on the guide (11) and mounting the guide (11) onto the cover (8) by being slid.

6. The household appliance (1) as in claim 1, further comprising:
   at least one cavity (18) arranged on the control panel (2); and
   at least one extension (19) situated on the cover (8) and suitable to be fitted into the cavity (18).

7. The household appliance (1) as in claim 1, wherein the household appliance (1) is a laundry dryer.

8. The household appliance (1) as in claim 1, wherein the household appliance (1) is a cooking device.

9. The household appliance (1) as in claim 1, wherein the household appliance (1) is a washing machine.

10. The household appliance (1) as in claim 1, wherein the household appliance (1) is a dishwasher.

11. The household appliance (1) as in claim 1, wherein the household appliance (1) is a cooling device.

12. The household appliance (1) as in claim 1, wherein the housing (Y) limits movement of the spring (5).

13. The household appliance (1) as in claim 1, wherein the second element (10) is shaped so as to partially enclose the spring (5) in a horizontal plane, and wherein the first element (9) is shaped such that the first element (9) and the second element (10) can join to fully enclose the spring (5) in the horizontal plane.

14. The household appliance (1) as in claim 1, wherein the spring (5) is a coil spring having more than one coil and wherein the first element (9) extends outwards from the cover (8) in parallel to a vertical plane though the more than one coil of the spring (5).

\* \* \* \* \*